US006845622B2

(12) United States Patent
Sauciuc et al.

(10) Patent No.: US 6,845,622 B2
(45) Date of Patent: Jan. 25, 2005

(54) PHASE-CHANGE REFRIGERATION APPARATUS WITH THERMOELECTRIC COOLING ELEMENT AND METHODS

(75) Inventors: Ioan Sauciuc, Phoenix, AZ (US); Gregory M. Chrysler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/401,376

(22) Filed: Mar. 27, 2003

(65) Prior Publication Data

US 2004/0187501 A1 Sep. 30, 2004

(51) Int. Cl.[7] .................................................. F25B 21/02
(52) U.S. Cl. ........................ 62/3.7; 62/3.2; 165/104.21
(58) Field of Search .................. 62/3.2, 3.7; 165/104.21

(56) References Cited

U.S. PATENT DOCUMENTS

| | | | | |
|---|---|---|---|---|
| 4,977,953 A | * | 12/1990 | Yamagishi et al. | ............ 165/10 |
| 5,255,520 A | * | 10/1993 | O'Geary et al. | ............... 62/3.2 |
| 5,761,909 A | * | 6/1998 | Hughes et al. | ................. 62/3.7 |
| 5,901,572 A | * | 5/1999 | Peiffer et al. | ................... 62/480 |
| 2002/0054615 A1 | | 5/2002 | Nagamatsu et al. | ........... 372/36 |
| 2002/0064194 A1 | | 5/2002 | Nagamatsu et al. | ........... 372/34 |
| 2002/0131731 A1 | | 9/2002 | Ikeda et al. | .................... 385/92 |
| 2003/0142712 A1 | | 7/2003 | Ikeda | .......................... 372/36 |

FOREIGN PATENT DOCUMENTS

| | | | |
|---|---|---|---|
| JP | 2000-165077 | 6/2000 | ............ H05K/7/20 |
| JP | 2001-221583 | 8/2001 | ........... F28D/15/02 |
| JP | 2002/280660 | 9/2002 | ........... H01S/5/024 |
| JP | 2002-280661 | 9/2002 | ........... H01S/5/024 |
| JP | 2003-075084 | 3/2003 | ........... F28D/15/02 |
| JP | 2003-148882 | 5/2003 | ........... F28D/15/02 |
| JP | 2003-179296 | 6/2003 | ........... H01S/5/024 |

* cited by examiner

*Primary Examiner*—Melvin Jones
(74) *Attorney, Agent, or Firm*—Schwegman, Lundberg, Woessner & Kluth, P.A.

(57) ABSTRACT

A heat-transfer device has a sealed vapor chamber with a phase-change fluid therein, and a thermoelectric cooling (TEC) element with a cooled side in thermal contact with the vapor chamber and a heated side in contact with heat-dissipation fins. The TEC element decreases the temperature of the vapor chamber and increases the temperature of the fins for improved efficiency. The vapor chamber is defined between concentrically positioned tubes, and a tunnel region is located within the inner tube. Additional TEC elements within the tunnel region further dissipate heat. In two-phase natural convection embodiments, TEC elements may further cool liquid returning to the heat source. Parallel heat dissipation paths may also be provided. In a two-phase forced convection embodiment, a TEC element may further cool liquid returning to the heat source, and additional TEC elements may be provided on the condenser. In some embodiments, active feedback controls the amount of energy transferred by a TEC element.

26 Claims, 7 Drawing Sheets

PHASE-CHANGE REFRIGERATION APPARATUS WITH THERMOELECTRIC COOLING ELEMENT AND METHODS

TECHNICAL FIELD

The present invention pertains to heat transfer mechanisms for integrated circuits.

BACKGROUND

As semiconductor devices, such as processors and processing elements, operate at continually higher data rates and higher frequencies they generally consume greater current and produce more heat. It is desirable to maintain operation of these device within certain temperature ranges for reliability reasons, among others. Convectional heat transfer mechanisms have restricted the operation of such devices to lower power levels, lower data rates and/or lower operating frequencies. Convectional heat transfer mechanisms have limited heat transfer capability due to size and location restrictions, as well as thermal limitations.

Thus what is need are improved heat transfer apparatus and methods suitable for semiconductor devices. What are also needed are heat transfer apparatus and methods that lower the operating temperature of processors. What are also needed are heat transfer apparatus and methods that allow processors to operate at higher power levels, higher data rates and/or higher frequencies. What are also needed are heat transfer apparatus and methods suitable for use in systems such as personal computers, servers, as well as other systems that use semiconductor devices.

BRIEF DESCRIPTION OF THE DRAWINGS

The appended claims are directed to some of the various embodiments of the present invention. However, the detailed description presents a more complete understanding of embodiments of the present invention when considered in connection with the figures, wherein like reference numbers refer to similar items throughout the figures and:

DETAILED DESCRIPTION

The following description and the drawings illustrate specific embodiments of the invention sufficiently to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. The scope of the embodiments of invention encompasses the full ambit of the claims and all available equivalents.

In embodiments, the present invention provides a heat-transfer device having a sealed vapor chamber with a phase-change fluid therein. The heat-transfer device includes a thermoelectric cooling (TEC) element with a cooled side in thermal contact with the vapor chamber and a heated side in contact with heat-dissipation fins. The TEC element may decrease the temperature of the vapor chamber and may increase the temperature of the fins for improved efficiency. The vapor chamber may be defined between concentrically positioned tubes, and a tunnel region may be located within the inner tube. In some embodiments, additional TEC elements within the tunnel region may be coupled to opposite internal surfaces of the inner tube. Heat dissipation fins within the tunnel region between the TEC elements may further dissipate heat. The TEC elements within the tunnel region may decrease the temperature of the internal surfaces of the inner tube. The TEC elements within the tunnel region may also increase a temperature of both ends of the fins within the tunnel region for improved thermal efficiency.

In embodiments, for a given processor power, the TEC elements may suppress the heat sink base temperature to values that could not otherwise be reached, and, in some embodiments, may approach temperatures below ambient. In embodiments, for a given heat sink base temperature (Ts), the TEC elements may allow more power to dissipate through beat sinks. Lower processor temperature may be achieved while dissipating greater processor heat.

Figure 1:
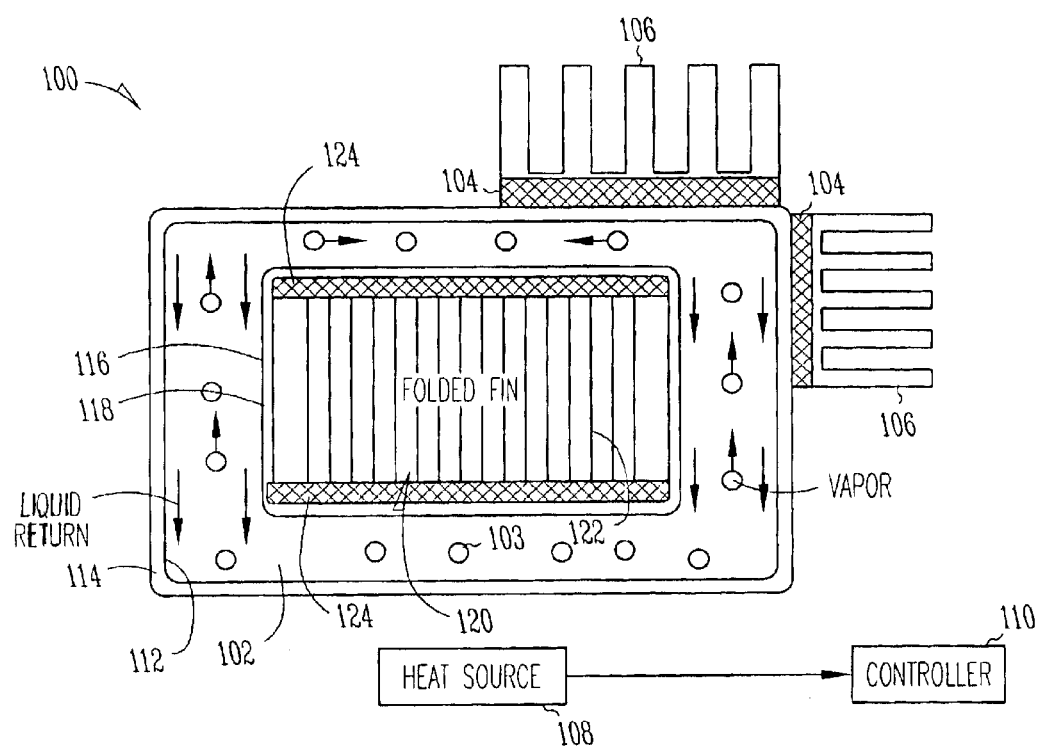
FIG. 1 is a cross-sectional illustration of a phase-change refrigeration device in accordance with an embodiment of the present invention.

FIG. 1 is a cross-sectional illustration of a phase-change refrigeration device in accordance with an embodiment of the present invention. One purpose of phase-change refrigeration device 100 is to remove heat from heat source 108 and to dissipate the heat with heat exchangers 106. Phase-change refrigeration device 100 includes vapor chamber 102 with phase-change fluid 103 therein. Device 100 may also include one or more thermoelectric cooling elements (TEC) 104, which may be positioned at various locations external to the chamber and may be in contact with heat exchangers 106 to dissipate heat. TEC elements 104 may have a cooled side in thermal contact with vapor chamber 102 and a heated side in contact with the heat exchangers 106. In accordance with embodiments of the present invention, TEC elements 104 may decrease the temperature of the phase change fluid within chamber 102 while increasing the temperature of heat exchangers 106. The higher temperature of heat exchangers 106 allows more heat to be dissipated improving the thermal efficiency of device 100. The lower temperature of phase change fluid 103 at condensation also improves the thermal efficiency of device 100.

In one embodiment, phase change fluid 103 may be evaporated by heat generated by heat source 108 which may be in thermal contact with chamber 102. The phase change fluid may also be condensed within chamber 102 through the cooling of the internal surfaces by TEC elements 104. In one embodiment, TEC elements 104 may decrease (e.g., sub-cool) the temperature of the fluid to below an ambient temperature.

The one or more TEC elements may decrease the temperature of vapor chamber 102 and increase the temperature of the heat exchangers based on an applied voltage or current. In one embodiment, controller 110 may monitor a temperature of heat source 108 and adjust the applied voltage or current based on the monitored temperature to maintain heat source 108 within a predetermined temperature range. In system 100, an extra amount of energy may be dissipated by heat exchange elements 106 due to their less than 100% efficiency.

In one embodiment, chamber 102 may be formed between internal surface 112 of tube 114 and external surface 116 of tube 118. Tube 118 may be positioned within tube 114 to form chamber 102. Tunnel region 120 may be within tube 118 and may include additional heat exchangers 122 (e.g., heat dissipation fins) therein. Tunnel region 120 may also include one or more TEC elements 124 located within tunnel region 120 and coupled with additional heat exchangers 122. In one embodiment, TEC elements 124 may be coupled to both sides of heat exchangers 122 (as illustrated) to increase the temperature on both sides of heat exchangers 122, further improving their efficiency. A lower thermal resistance can be achieved.

TEC elements 104 and 124 may be any device that functions as a small heat pump, and in some embodiments, they may be semiconductor-based elements. When voltage (or current depending on the embodiment) is applied to a TEC element, heat is transferred from one side of a TEC element to the other side. In other words, one side is cooled while the other side is heated. The amount of heat transferred may be a function of the applied voltage. A reversal of the voltage may reverse the direction of heat transfer.

Heat exchangers 106 and 122 may be any heat exchange device or element including, for example, heat dissipation fins. In one embodiment, heat exchangers 122 may be folded fins, while in other embodiments, they may be parallel plates, extruded fins, offset strip fins or pin fins. In embodiments that include pin fins, for example, the pin fins may be in-line or staggered. Heat source 108 may be any source that generates heat including, for example, electronic circuitry, semiconductor chips and devices, one or more microprocessors and/or processing elements, graphics cards or graphics chips or chipsets, and power converter components.

In one embodiment, device 100 may include a wicking element (not illustrated) within vapor chamber 102 to help return the condensed liquid to a region near heat source 108 for subsequent evaporation. A wicking element may be included when heat source 108 is not located at the bottom of chamber 102.

Although tubes 114 and 118 are illustrated as having a rectangular cross-section, tubes of other cross-sections may also be used to form vapor chamber 102 and provide tunnel 120. In embodiments, tubes 114 and 118 may be comprised of almost any thermally conductive material including, for example, metals such as copper or copper alloys, or aluminum or aluminum alloys. Phase-change fluid 103 may be one of many fluids suitable for changing state as part of a heat transfer process. Examples of suitable phase-change fluids include water, alcohol, ammonia, propane, and various commercial refrigerants, such as R134a, R22 and R12 and including other halocarbon or hydrocarbon refrigerants. Phase-change fluid 103 may be selected based on the desired temperature range that heat source 108 and its heat dissipation requirements, as well as other factors associated with device 100. Through the use of TEC elements 104, the temperature of heat source 108 may even be maintained below an ambient temperature.

The term "suitable", as used herein, means having characteristics that are sufficient to produce a desired result. Suitability for the intended purpose can be determined by one of ordinary skill in the art using only routine experimentation.

Figure 2A:
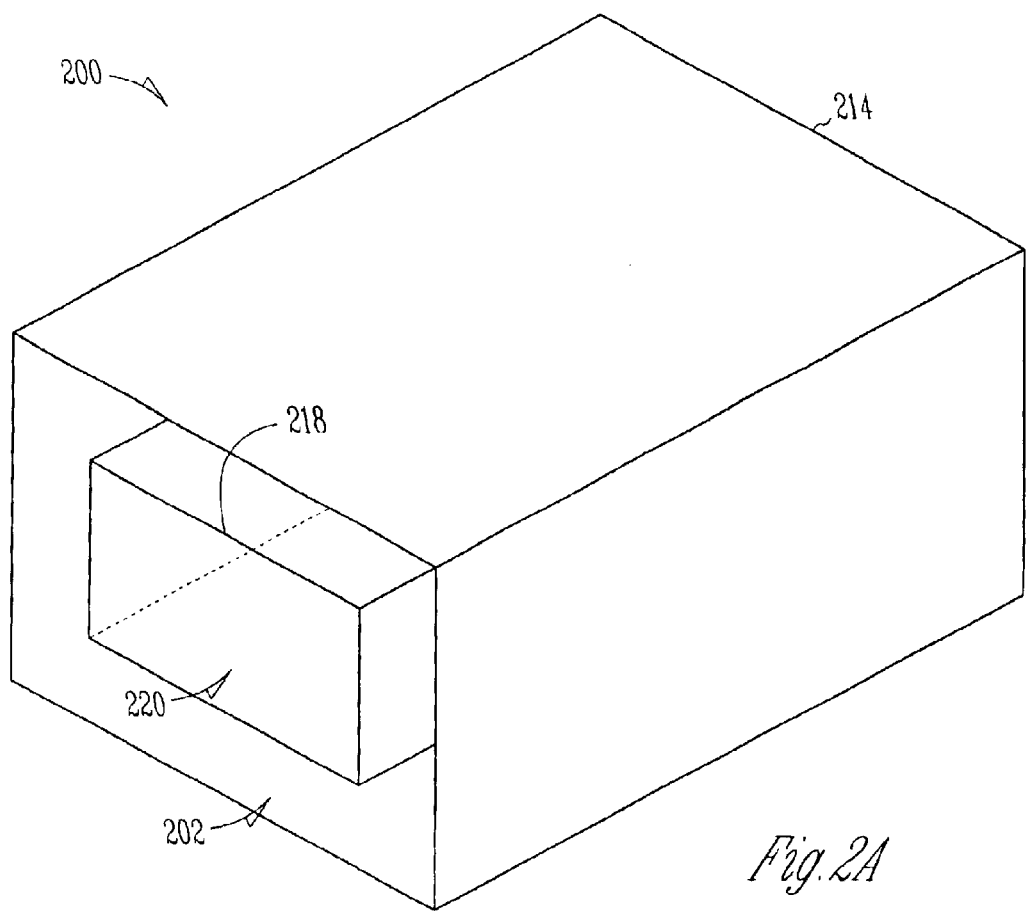
FIG. 2A illustrates a perspective view of the phase-change refrigeration device of FIG. 1 in accordance with an embodiment of the present invention.
Figure 2B:
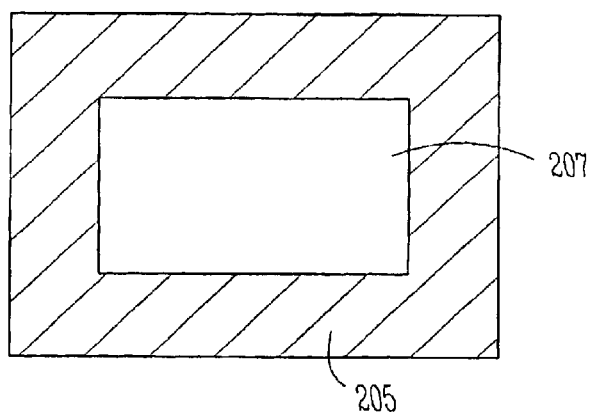
FIG. 2B illustrates an end cap suitable for use with the phase-change refrigeration device of FIG. 2A.

FIG. 2A illustrates a perspective view of the phase-change refrigeration device of FIG. 1 in accordance with an embodiment of the present invention. FIG. 2B illustrates an end cap suitable for use with the phase-change refrigeration device of FIG. 2A. Device 200 may include tubes 214 and 218 corresponding respectively with tubes 114 and 118 (FIG. 1) which form vapor chamber 202 which may correspond with vapor chamber 102 (FIG. 1). Device 200 may also include tunnel 220, which may correspond with tunnel region 120 (FIG. 1). For simplicity, TEC elements and heat exchangers, among other things, are not illustrated in FIG. 2A. End cap 205 may be used to seal each end of chamber 202 and may have hole 207 therein to allow airflow through tunnel region 220.

Figure 3A:
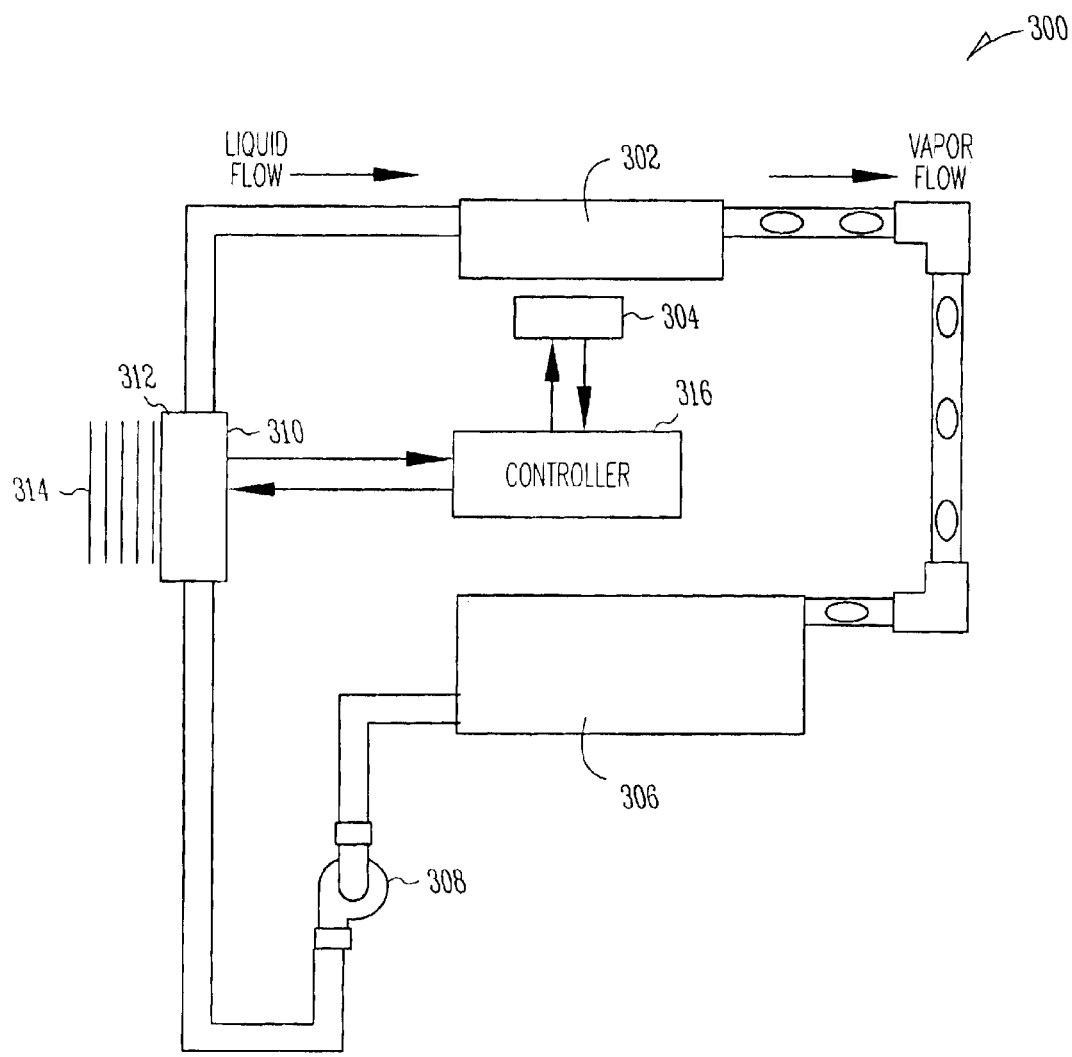
FIG. 3A is a circuit diagram illustrating the operation of a phase-change refrigeration system in accordance with another embodiment of the present invention.

FIG. 3A is a circuit diagram illustrating the operation of a phase-change refrigeration system in accordance with another embodiment of the present invention. Phase-change refrigeration system 300 may include evaporator 302 to evaporate (e.g., change the phase) a phase-change fluid by absorbing heat from heat source 304. In some embodiments, evaporator 302 may be a cold plate. The phase change fluid, in substantially vapor form, travels to heat exchanger 306, where it may condense to a liquid. The liquid may be moved by pump 308 to heat transfer area 310 where it may be sub-cooled by TEC element 312. "Sub-cooling", as used herein, refers to cooling below a temperature that could be achieved without a TEC element. TEC element 312 may be located outside or external to the elements containing the phase-change fluid, and, in one embodiment, TEC element 312 may be coupled directly to a pipe through which the phase change fluid, in liquid form, may flow. This pipe, in heat transfer area 310, may have a rectangular cross-section and may provide good thermal conductivity with TEC element 312. System 300 may also include a heat dissipation element 314 coupled to the heated side of TEC element 312. Heat dissipation element 314 may, for example, include heat dissipation fins.

TEC element 312 may decrease the temperature of heat transfer area 312 and increase the temperature of heat dissipation element 314 in response to an applied voltage or current, which may improve the thermal efficiency of system 300. After being sub-cooled by TEC element 312, refrigerated liquid may enter evaporator 302 at below ambient temperature to cool heat source 304 completing the cycle. In general, most of the heat may be dissipated through heat exchanger 306, with some heat dissipated through element 314.

In some embodiments, system 300 may include controller 316 to monitor a temperature of heat source 304 and generate a voltage/current to apply to TEC element 312 to help regulate the temperature of heat source 304. In other words, the amount of cooling or sub-cooling may be controlled by a feed back system. Similar to system 100 (FIG. 1), in one embodiment, controller 316 may be part of heat source 304. For example, when heat source 304 is a processor or processing system, controller 316 may operate within the processor or processing system (e.g., as software with a sensor input).

System 300 may be a sealed system and may use one or more of the various phase-change fluids discussed above for system 100 (FIG. 1). Pump 308 may be a commercially available pump, which may be selected based on the phase-change change fluid being used in system 300. In one embodiment, heat exchanger 306 may be a forced convection heat exchanger-condenser. System 300 may be viewed as a forced convection refrigeration device that may achieve refrigeration without a compressor. When a refrigerant, such as R134a, is used for the phase-change fluid, freezing and leaking is less of a concern than if water were used.

Figure 3B:
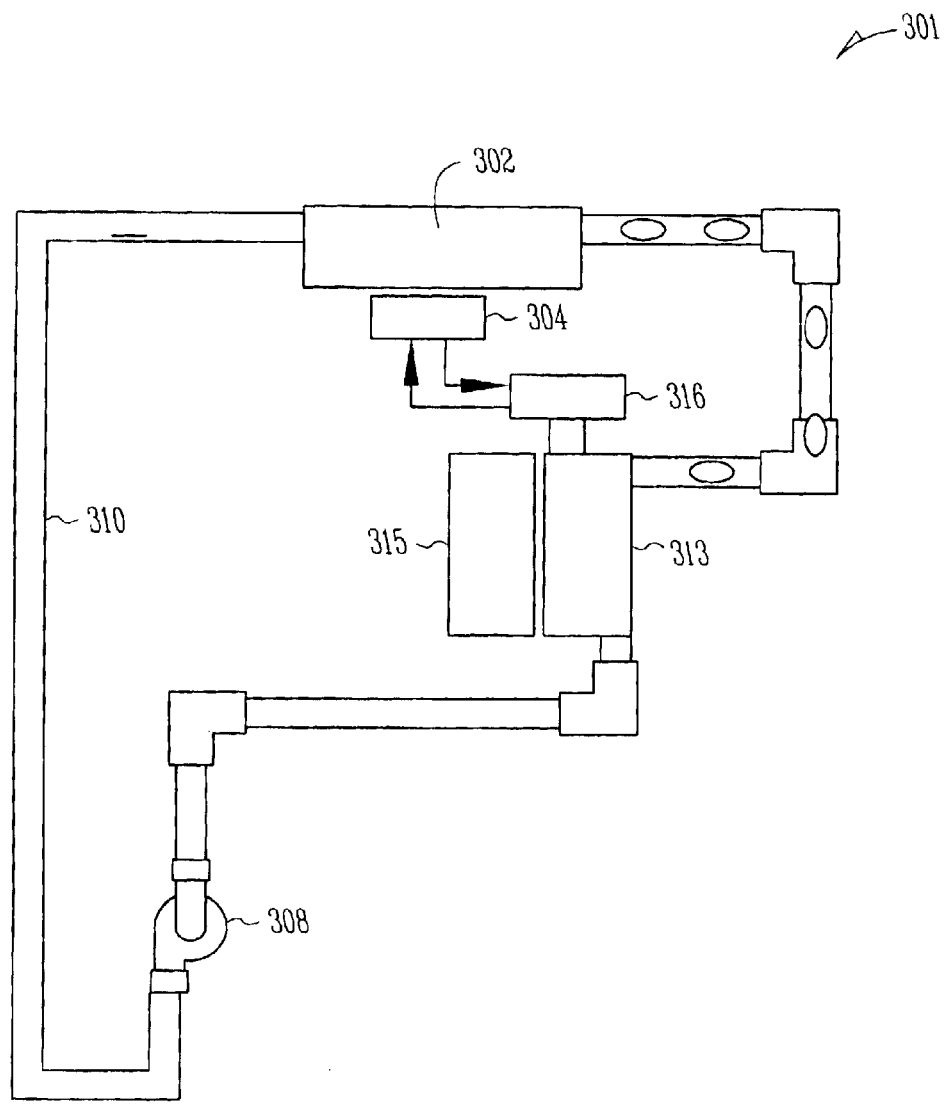
FIG. 3B is a circuit diagram illustrating the operation of a phase-change refrigeration system in accordance with another embodiment of the present invention.

FIG. 3B is a circuit diagram illustrating the operation of a phase-change refrigeration system in accordance with another embodiment of the present invention. System 301, illustrated in FIG. 3B, is similar to system 300 (FIG. 3), and includes one or more TEC elements 313 with heat exchanger 315 to help condense vapor from evaporator 302. Heat exchanger 315 may be a remote heat exchanger similar to condenser 306 (FIG. 3A), however heat exchanger 315 may operate at a higher temperature for improved efficiency. In embodiments, similar to system 300 (FIG. 3A), system 301 may include additional TEC elements (not illustrated) and heat dissipation fins (not illustrated in FIG. 3B) coupled to pipe 310 to further reduce the temperature of the liquid returning to evaporator 302.

Figure 4:
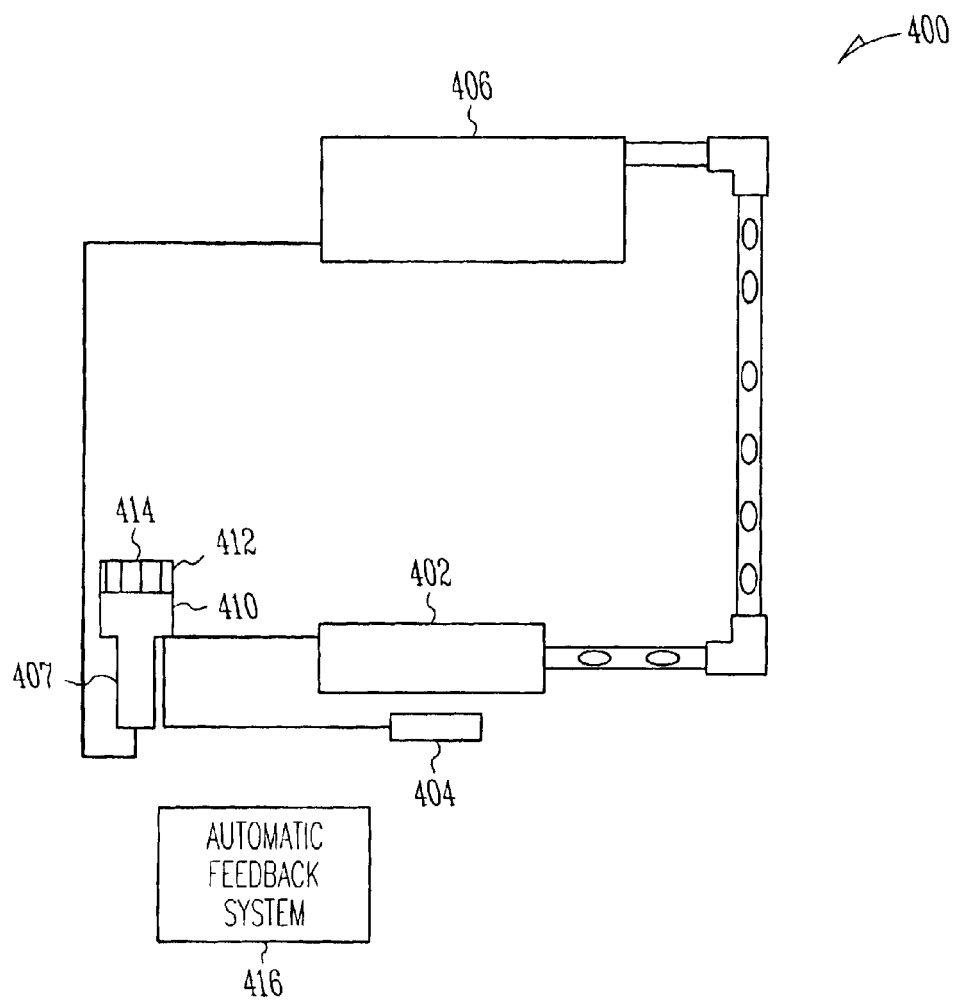
FIG. 4 is a circuit diagram illustrating the operation of a phase-change refrigeration system in accordance with another embodiment of the present invention.

FIG. 4 is a circuit diagram illustrating the operation of a phase-change refrigeration system in accordance with another embodiment of the present invention. System 400 may achieve high refrigeration performance without the use of a pump by using natural convection. System 400 operates similarly to system 300 (FIG. 3). In system 400, condenser 406 may be located above evaporator 402 and gravity may return liquid from condenser 406 to reservoir 407. The liquid may be cooled or sub-cooled by TEC element 412 at region 410 before being drawn into evaporator 402. Elements of system 400, such as heat source 404, controller 416, heat dissipation element 414, and condenser 406 may be similar to those of system 300, although in some embodiments, a larger heat exchanger coupled with condenser 406 may be used.

Figure 5:
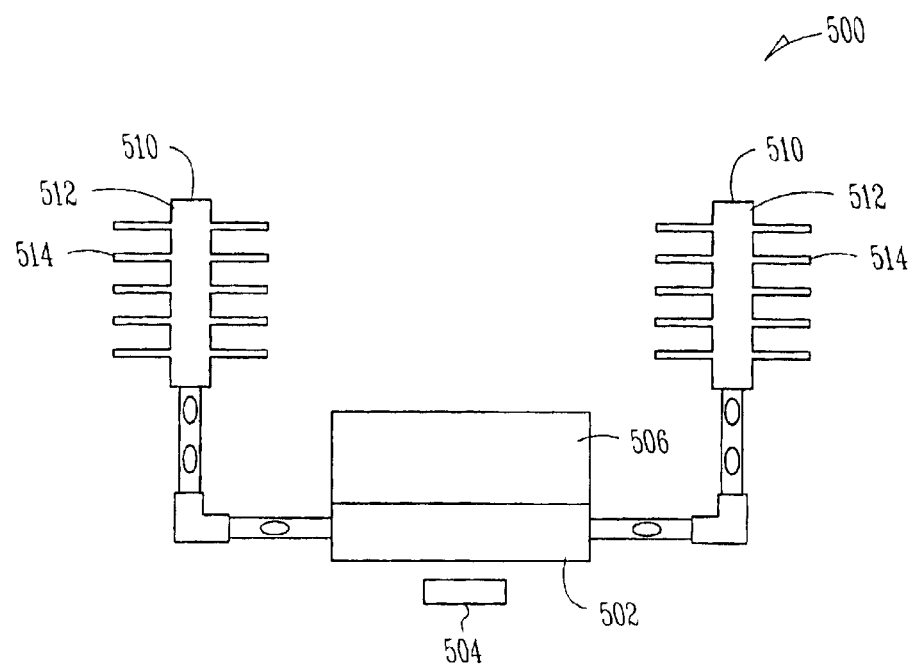
FIG. 5 is a circuit diagram illustrating the operation of a phase-change refrigeration system in accordance with yet another embodiment of the present invention.

FIG. 5 is a circuit diagram illustrating the operation of a phase-change refrigeration system in accordance with another embodiment of the present invention. Phase-change refrigeration system 500 is a phase-change natural convection refrigeration system and may be a gravity independent system. Similar to system 300 (FIG. 3) and system 400 (FIG. 4), system 500 includes evaporator 502, heat source 504 and condenser 506. Condenser 506 may include a vapor chamber or may include heat sinks with embedded heat pipes. System 500 may also include one or more TEC elements 512 located external and thermally connected to heat pipe 510. Heat dissipation elements 514 may be attached to TEC elements 512 and may be heated by TEC elements 512 to improve their heat dissipation ability. TEC elements 512 may also cool or sub-cool the fluid within pipes 510 allowing low-mass flow rates to be cooled at low temperature differences. System 500 may also include a controller (not illustrated) to control the TEC elements based on the temperature of the heat source.

One embodiment of system 500 may be position or gravity independent. In this embodiment, heat pipes 510 may include a wicking material therein to draw condensed fluid from where TEC elements 512 are located to the region where condenser 506 is located. The wicking material may allow system 500 to operate in an upside down or a sideways position from that illustrated in FIG. 5. In embodiments, system 500 may include additional heat pipes 510 with or without wicking material, TEC elements 512, and heat dissipation elements 514. These embodiments may provide one or more parallel paths to allow the cooled fluid to return to the heat source. Although FIG. 5 illustrates two such parallel paths, the present invention is equally suitable to one return path, as well as several return paths.

Figure 6:
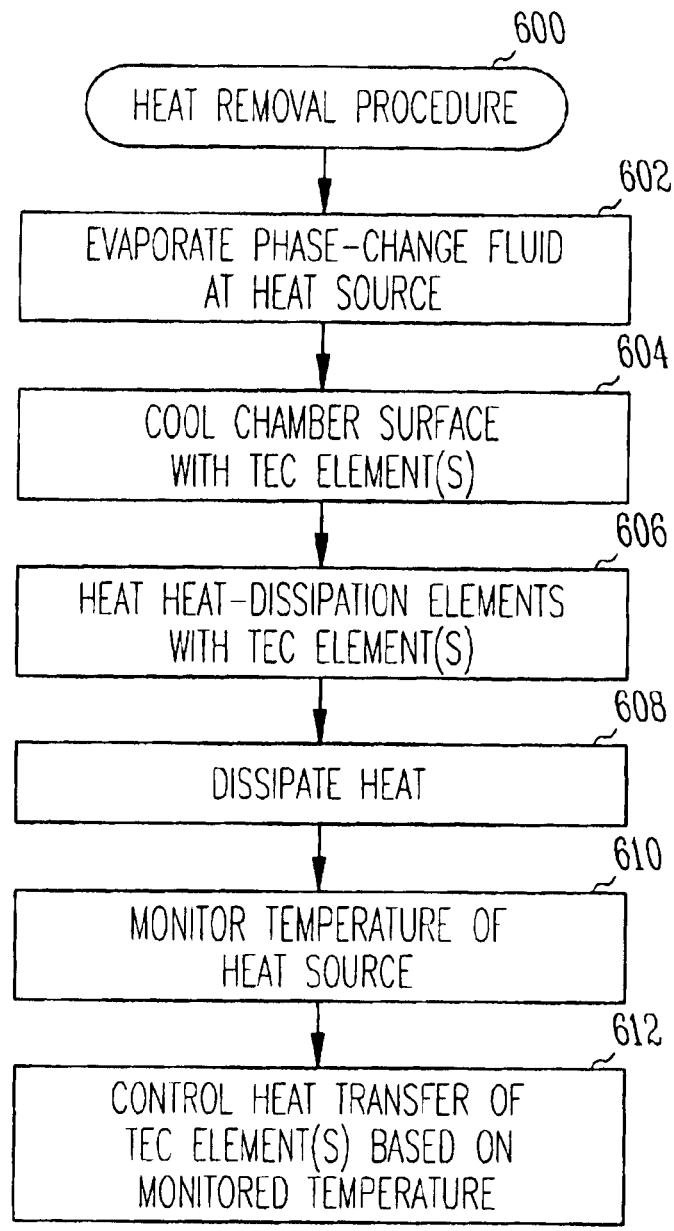
FIG. 6 is a flow chart of a heat removal procedure in accordance with an embodiment of the present invention.

FIG. 6 is a flow chart of a heat removal procedure in accordance with an embodiment of the present invention. Procedure 600 may be performed by a phase-change refrigeration device, such as device 100 (FIG. 1), device 300 (FIG. 3), device 400 (FIG. 4) or device 500 (FIG. 5), although other phase-change refrigeration devices may also be suitable. Procedure 600 may be used to remove heat from a heat source, such as a processor or processing element or other heat generating element. Furthermore, procedure 600 may be used to regulate the temperature of a heat source and maintain a temperature of a heat source within a predetermined range when the heat source is generating heat.

In block 602, phase-change fluid is evaporated by a heat source to generate a vapor. The vapor may be evaporated into a vapor chamber, such as vapor chamber 102 (FIG. 1).

In block 604, the vapor chamber may be cooled by a TEC element to condense the vapor to liquid and to cool the liquid. The liquid may be cooled to a below-ambient temperature. In one embodiment, TEC elements 104 (FIG. 1) may cool internal surfaces of vapor chamber 102 (FIG. 1).

In block 606, the TEC elements may increase the temperature of heat-dissipation elements. The heating of the heat-dissipation elements may improve their thermal efficiency because of the increased temperature differential with ambient. The heat-dissipation elements may be heat dissipation fins and may be attached to the heated side of the TEC elements.

In block 608, heat from the TEC elements may be removed by the heat dissipation elements and may be dissipated. In one embodiment, block 608 may be performed by heat dissipation elements, such as fins, within a tunnel region, such as tunnel region 120 (FIG. 1). In this embodiment, the tunnel region may include TEC elements (e.g., TEC elements 124) to heat both sides of the heat dissipation elements to further improve their heat dissipation capacity. In addition, the TEC elements within the tunnel region may cool surfaces of the vapor chamber.

In block 610, the temperature of the heat source may be monitored. In one embodiment, a controller, such as controller 110 (FIG. 1), may monitor the temperature of a heat source.

In block 612, the controller may generate a control signal, such as a voltage or current, to apply to one or more the TEC elements. The control signal may increase the amount of heat transfer performed by the TEC elements when the temperature of the heat source exceeds a predetermined temperature or temperature range, and may decrease the amount of heat transfer performed by the TEC elements when the temperature of the heat source is below a predetermined temperature or temperature range. In embodiments, the control signal may be either a voltage or current, depending on the TEC element used in the system. Accordingly, block 612 provides a feedback to control the cooling and heating in operations 604 and 608.

Although the individual operations of procedure 600 are illustrated and described as separate operations, one or more of the individual operations may be performed concurrently and nothing requires that the operations be performed in the order illustrated.

Thus improved heat transfer apparatus and methods suitable for semiconductor devices have been described. Heat transfer apparatus and methods that lower the operating temperature of processors have also been described. Heat transfer apparatus and methods that allow processors to operate at higher power levels, higher data rates and/or higher frequencies have also been described. Heat transfer apparatus and methods suitable for use in systems such as personal computers, servers, as well as other systems that use semiconductor devices have also been described.

The foregoing description of specific embodiments reveals the general nature of the inventive subject matter sufficiently that others can, by applying current knowledge, readily modify and/or adapt it for various applications without departing from the generic concept. Therefore such adaptations and modifications are within the meaning and range of equivalents of the disclosed embodiments. The phraseology or terminology employed herein is for the purpose of description and not of limitation. Accordingly, embodiments of the invention embrace all such alternatives, modifications, equivalents and variations as fall within the spirit and scope of the appended claims.

What is claimed is:

1. A heat-transfer device comprising:
   a sealed vapor chamber having a phase-change fluid therein; and
   a thermoelectric cooling (TEC) element having a first side in thermal contact with the vapor chamber and a second side in contact with heat-dissipation fins, the TEC element to decrease the temperature of the vapor chamber and increase the temperature of the fins to improve efficiency,
   wherein a heat source is in thermal contact with the vapor chamber, heat from the heat source to evaporate the phase-change fluid, the phase-change fluid to condense within the vapor chamber, the TEC element to cool the vapor chamber.

2. The device of claim 1 wherein the heat source is a processor, and wherein the TEC element is to decrease the temperature of the fluid in the vapor chamber to a temperature below an ambient temperature.

3. A heat-transfer device comprising:
   a sealed vapor chamber having a phase-change fluid therein; and
   a thermoelectric cooling (TEC) element having a first side in thermal contact with the vapor chamber and a second side in contact with heat-dissipation fins, the TEC element to decrease the temperature of the vapor chamber and increase the temperature of the fins to improve efficiency,
   wherein the TEC element is responsive to an applied voltage to decrease the temperature of the vapor chamber and to increase the temperature of the fins, and
   wherein the device further comprises a controller to monitor a temperature of the heat source and to adjust the applied voltage based on the monitored temperature to maintain the heat source within a predetermined temperature range.

4. A heat-transfer device comprising:
   a sealed vapor chamber having a phase-change fluid therein; and
   a thermoelectric cooling (TEC) element having a first side in thermal contact with the vapor chamber and a second side in contact with heat-dissipation fins, the TEC element to decrease the temperature of the vapor chamber and increase the temperature of the fins to improve efficiency,
   wherein the vapor chamber is defined between an internal surface of a first tube and an external surface of a second tube positioned within the first tube.

5. The device of claim 4 further comprising a tunnel region having additional heat dissipation fins therein, the tunnel being within the second tube.

6. The device of claim 5 wherein the additional heat dissipation fins are coupled to opposite sides of the tunnel region.

7. The device of claim 4 further comprising:
   a tunnel region located within the second tube;
   first and second TEC elements within the tunnel region coupled to opposite internal surfaces of the second tube; and
   heat dissipation fins within the tunnel region between the first and second TEC elements, the first and second TEC elements to decrease a temperature of the internal surfaces of the second tube, and to increase a temperature of both ends of the fins within the tunnel region.

8. The device of claim 7 wherein the first and second TEC elements are responsive to an applied voltage to decrease the temperature of the vapor chamber and to increase the temperature of the fins, and
   wherein the device further comprises a controller to monitor a temperature of a heat source and to adjust the applied voltage applied based on the monitored temperature to maintain the heat source within a predetermined temperature range.

9. The device of claim 7 further comprising a fan to provide air flow across the heat dissipation fins within the tunnel region.

10. The device of claim 4 wherein the first and second tubes have substantially a rectangular cross-section and the first and second tubes are held substantially concentric with each other by end caps to seal the vapor chamber.

11. The device of claim 10 wherein at least one TEC element is coupled to an external surface of the first tube.

12. The device of claim 4 wherein the tubes are comprised of copper or a copper alloy and the phase-change fluid comprises water.

13. The device of claim 4 wherein the tubes are comprised of aluminum or an aluminum alloy and the phase change fluid comprises either a refrigerant or an alcohol.

14. A heat transfer device comprising:
   an evaporator to absorb heat from a heat source and to convert a phase-change fluid to vapor;
   a heat exchanger to condense the vapor to liquid;
   a thermoelectric cooling (TEC) element to cool the liquid;
   heat dissipation fins coupled to a heated side of the TEC element; and
   a pump to move the liquid from the heat exchanger to the TEC element.

15. The device of claim 14 wherein the TEC element is coupled to a heat pipe in a heat transfer area between the pump and the evaporator to reduce the temperature of the liquid returning to the evaporator.

16. The device of claim 15 further comprising an additional TEC element coupled to the heat exchanger to reduce a temperature of the heat exchanger to condense the phase-change fluid.

17. The device of claim 14 wherein the TEC element is coupled to the heat exchanger to reduce a temperature of the heat exchanger to condense the phase-change fluid.

18. A heat transfer device comprising:
   an evaporator to absorb heat from a heat source and to convert a phase-change fluid to vapor;
   a heat exchanger to condense the vapor to liquid;
   a thermoelectric cooling (TEC) element to cool the liquid,
   wherein the heat exchanger includes a forced convection heat exchanger for positioning above the evaporator, wherein gravity returns the condensed liquid from the heat exchanger to the TEC element.

19. The device of claim 15 wherein the TEC element has a cooled side that is externally coupled to a pipe having the liquid therein, the TEC element to cool the liquid within the pipe to a sub-ambient temperature.

20. The device of claim 19 wherein the TEC element is responsive to an applied voltage to decrease the temperature of the pipe and to increase the temperature of the fins, and wherein the device further comprises a controller to monitor a temperature of the heat source and to adjust the applied voltage based on the monitored temperature to maintain the heat source within a predetermined temperature range.

21. A heat transfer device comprising:

an evaporator to absorb heat from a heat source and to convert a phase-change fluid to vapor;

a heat exchanger to condense the vapor to liquid;

a thermoelectric cooling (TEC) element to cool the liquid, wherein the TEC element and the heat dissipation fins comprise a first TEC element and first heat dissipation fins to provide a first path to at least return the liquid to the evaporator within a first heat pipe, and wherein the device further comprises second heat dissipation fins coupled to a second TEC element to provide a second path to at least return the liquid to the evaporator within a second heat pipe.

22. The device of claim 21 further comprising first and second heat pipes that include wicking material therein to help draw the liquid to the evaporator.

23. A method comprising:

evaporating a phase-change fluid with heat from a heat source to generate a vapor;

condensing the vapor with a thermoelectric cooling (TEC) element;

sub-cool the fluid; and dissipating heat from the TEC element, wherein evaporating comprises evaporating the phase-change fluid within a chamber, and wherein condensing comprises cooling internal surfaces of the chamber with the TEC element.

24. The method of claim 23 wherein condensing comprises the TEC element cooling the temperature of the fluid in the chamber to a temperature below an ambient temperature.

25. The method of claim 24 wherein condensing comprises the TEC element cooling the temperature of the fluid in the chamber based on an applied voltage, and wherein the method further includes:

monitoring a temperature of the heat source; and adjusting the applied voltage based on the monitored temperature to maintain the heat source within a predetermined temperature range.

26. A method comprising:

evaporating a phase-change fluid with heat from a heat source to generate a vapor;

condensing the vapor with a thermoelectric cooling (TEC) element;

sub-cool the fluid; and dissipating heat from the TEC element, wherein dissipating heat comprises the TEC element at least in part to heat fins for improved heat-dissipation efficiency.

* * * * *